United States Patent
Peng et al.

(10) Patent No.: US 11,462,719 B2
(45) Date of Patent: Oct. 4, 2022

(54) ORGANIC LIGHT EMITTING TRANSISTOR, TEMPERATURE SENSING DEVICE AND TEMPERATURE DETECTING METHOD

(71) Applicants: HEFEI XINSHENG OPTOELECTRONICS TECHNOLOGY CO., LTD., Anhui (CN); Beijing BOE Technology Development Co., Ltd., Beijing (CN)

(72) Inventors: Rui Peng, Beijing (CN); Qinghe Wang, Beijing (CN); Lei Zhang, Beijing (CN); Xinxin Wang, Beijing (CN); Yue Hu, Beijing (CN); Zhijie Ye, Beijing (CN)

(73) Assignees: HEFEI XINSEENG OPTOELECTRONICS TECHNOLOGY CO., LTD., Anhui (CN); Beijing BOE Technology Development Co., Ltd., Beijing (CN)

( * ) Notice: Subject to any disclaimer, the term of this patent is extended or adjusted under 35 U.S.C. 154(b) by 727 days.

(21) Appl. No.: 16/408,773

(22) Filed: May 10, 2019

(65) Prior Publication Data

US 2020/0168845 A1   May 28, 2020

(30) Foreign Application Priority Data

Nov. 23, 2018   (CN) .......................... 201811408107.4

(51) Int. Cl.
*H01L 51/52*   (2006.01)
*G01K 7/22*   (2006.01)
(Continued)

(52) U.S. Cl.
CPC ............ *H01L 51/5296* (2013.01); *G01K 7/22* (2013.01); *H01L 51/006* (2013.01); *H01L 51/0037* (2013.01); *H01L 51/0048* (2013.01); *H01L 51/0059* (2013.01); *H01L 51/0065* (2013.01); *H01L 51/0072* (2013.01); *H01L 51/0081* (2013.01); *H01L 51/0097* (2013.01); *H01L 51/5056* (2013.01); *H01L 51/5072* (2013.01);
(Continued)

(58) Field of Classification Search
CPC ............ H01L 51/5296; H01L 51/0037; H01L 51/0048; H01L 51/0059; H01L 51/006; H01L 51/0065; H01L 51/0072; H01L 51/0081; H01L 51/0097; H01L 51/5056; H01L 51/5072; H01L 51/5088; H01L 51/5092; H01L 51/5203; H01L 51/529; G01K 7/22

See application file for complete search history.

(56) References Cited

U.S. PATENT DOCUMENTS

2018/0006097 A1\*   1/2018   Xiong ................. H01L 27/3248
2019/0331536 A1\*   10/2019   Hioki ...................... H01C 7/04

\* cited by examiner

*Primary Examiner* — Anne M Hines
(74) *Attorney, Agent, or Firm* — Westman, Champlin & Koehler, P.A.

(57) ABSTRACT

Embodiments of the present disclosure provide an organic light emitting transistor comprising: a substrate, and a gate electrode, a gate insulating layer, source/drain electrodes and a light emitting functional layer disposed on the substrate, wherein the organic light emitting transistor further comprises an external electrode coupled to the gate electrode in series, wherein a temperature-dependent resistance change rate of the gate electrode is different from a temperature-dependent resistance change rate of the external electrode.

20 Claims, 5 Drawing Sheets

(51) Int. Cl.
*H01L 51/00* (2006.01)
*H01L 51/50* (2006.01)
(52) U.S. Cl.
CPC ...... *H01L 51/5088* (2013.01); *H01L 51/5092* (2013.01); *H01L 51/5203* (2013.01); *H01L 51/529* (2013.01)

ORGANIC LIGHT EMITTING TRANSISTOR, TEMPERATURE SENSING DEVICE AND TEMPERATURE DETECTING METHOD

CROSS REFERENCE TO RELATED APPLICATION

The present application claims a priority benefit of Chinese Patent Application No. 201811408107.4, filed on Nov. 23, 2018, the entirety of which is incorporated herein by reference.

TECHNICAL FIELD

The present disclosure relates to the technical field of temperature detecting, and in particular to an organic light emitting transistor, a temperature sensing device and a temperature detecting method.

BACKGROUND

With development of internet of things and information technologies, sensors are also developing from conventional signal detection to the trend of being multifunctional, flexible, small size, highly precise, and visualized.

SUMMARY

Embodiments of the present disclosure provide an organic light emitting transistor, a temperature sensing device and a temperature detecting method.

In an aspect, the embodiments of the present disclosure provide an organic light emitting transistor, comprising: a substrate, and a gate electrode, a gate insulating layer, source/drain electrodes and a light emitting functional layer disposed on the substrate, wherein the organic light emitting transistor further comprises an external electrode coupled to the gate electrode in series, wherein a temperature-dependent resistance change rate of the gate electrode is different from a temperature-dependent resistance change rate of the external electrode.

Optionally, an integrated body comprised of the gate electrode and the external electrode comprises a thermosensitive portion formed by a thermosensitive material and a non-thermosensitive portion formed by a non-thermosensitive material, wherein the proportion of the thermosensitive portion in the gate electrode is different from the proportion of the thermosensitive portion in the external electrode.

Optionally, a material for forming the gate electrode is a thermosensitive material, and a material for forming the external electrode is a non-thermosensitive material. Alternatively, a material for forming the external electrode is a thermosensitive material, and a material for forming the gate electrode is a non-thermosensitive material.

Optionally, the thermosensitive material is a mixture of carbon nanotubes and poly(3,4-ethylenedioxythiophene)-poly(styrenesulfonate) having a core-shell structure.

Optionally, a light output by the light emitting functional layer has a color which changes with a resistance of the gate electrode.

Optionally, the light emitting functional layer comprises an electron injection layer, a light emitting layer and a hole injection layer sequentially disposed in lamination.

Optionally, a material of the light emitting layer comprises a mixture of 2,9-dimethyl-4,7-diphenyl-1,10-phenenthroline (BCP) and (4-(dicyanomethylene)-2-t-butyl-6-(1,1,7,7-tetramethyljulolidyl-9-enyl)-4H-pyran) (DCJTB), wherein a ratio of DCJTB in the light emitting layer is in a range of 0.5 wt % to 10 wt %.

Optionally, a material of the hole injection layer is 4,4',4"-tri(N-3-methylphenyl-N-phenylamino)triphenylamine, and a material of the electron injection layer is lithium fluoride.

Optionally, the organic light emitting transistor further comprises an electron transport layer and a hole transport layer, wherein the electron transport layer is disposed between the electron injection layer and the light emitting layer, and the hole transport layer is disposed between the light emitting layer and the hole injection layer.

Optionally, a material of the hole transport layer is N,N'-diphenyl-N,N'-(1-naphthyl)-1,1'-biphenyl-4,4'-diamine (NPB), and a material of the electron transport layer is 8-hydroxyquinoline aluminum.

Optionally, a material of the electron injection layer further comprises 8-hydroxyquinoline aluminum, and a material of the hole injection layer further comprises N,N'-diphenyl-N,N'-(1-naphthyl)-1,1'-biphenyl-4,4'-diamine.

Optionally, the substrate is a flexible substrate.

Optionally, the gate electrode has a grid shape. Alternatively, the gate electrode comprises one electrode wire.

Optionally, the gate electrode comprises at least two electrode wires sequentially arranged, and an arrangement direction of the at least two electrode wires is perpendicular to an extending direction of the at least two electrode wires, wherein the at least two electrode wires are arranged with concave and convex distributed alternately in the extending direction.

Optionally, the gate electrode, the gate insulating layer, the source electrode, the light emitting functional layer and the drain electrode are sequentially disposed in lamination along a direction perpendicular to the substrate.

Optionally, along a direction perpendicular to the substrate, the gate electrode, the gate insulating layer and the light emitting functional layer are sequentially disposed in lamination, and the source/drain electrodes are disposed on the light emitting functional layer, wherein a channel is formed in the light emitting functional layer between the source electrode and the drain electrode.

In another aspect, the embodiments of the present disclosure provide a temperature sensing device, comprising the organic light emitting transistor as described above, and a controller coupled to the gate electrode and the source/drain electrodes of the organic light emitting transistor, wherein the controller is configured to apply a voltage to an integrated body comprised of the gate electrode and the external electrode and the source/drain electrodes, such that a positive voltage difference or a negative voltage difference is formed between the gate electrode and the source electrode and between the drain electrode and the source electrode respectively.

Optionally, the controller is further configured to acquire a real-time source/drain current, and acquire a real-time gate electrode voltage from the real-time source/drain current according to a correspondence relationship between the source/drain current and the gate electrode voltage; and the controller is further configured to acquire a real-time first resistance from the real-time gate electrode voltage according to a correspondence relationship between the first resistance and the gate electrode voltage, and acquire a real-time temperature of an object to be detected from the real-time first resistance according to a correspondence relationship between the first resistance and the temperature, wherein the first resistance is a resistance of a thermosensitive material in the integrated body comprised of the gate electrode and the external electrode or a resistance of the integrated body comprised of the gate electrode and the external electrode.

In yet another aspect, the embodiments of the present disclosure provide a temperature detecting method using the organic light emitting transistor as described above, comprising: applying a voltage to an integrated body comprised of the gate electrode and the external electrode and the source/drain electrodes, such that a positive voltage difference or a negative voltage difference is formed between the gate electrode and the source electrode and between the drain electrode and the source electrode respectively; acquiring a real-time source/drain current; acquiring a real-time gate electrode voltage from the real-time source/drain current according to a correspondence relationship between the source/drain current and the gate electrode voltage; acquiring a real-time first resistance from the real-time gate electrode voltage according to a correspondence relationship between the first resistance and the gate electrode voltage; and acquiring a real-time temperature of an object to be detected from the real-time first resistance according to a correspondence relationship between the first resistance and the temperature, wherein the first resistance is a resistance of a thermosensitive material in the integrated body comprised of the gate electrode and the external electrode or a resistance of the integrated body comprised of the gate electrode and the external electrode.

BRIEF DESCRIPTION OF DRAWINGS

To more clearly illustrate the technical solutions in the embodiments of the present disclosure, the drawings to be used in the description of the embodiments or related art will be briefly introduced below. Obviously, the drawings described are only some embodiments of the present disclosure, and for those skilled in the art, other drawings can be obtained according to these drawings without inventive efforts.

DETAILED DESCRIPTION

The technical solutions in embodiments of the present disclosure will be detailedly described below in combination with the drawings. Obviously, the embodiments described are only a part of, not all of the embodiments of the present disclosure. All of other embodiments obtained by those skilled in the art based on the embodiments of the present disclosure, without inventive efforts, fall within the protection scope of the present invention.

In the description of the present disclosure, it should be understood that direction or position relationship indicated by the term "center", "above", "below", "front", "back", "left", "right", "vertical", "horizontal", "top", "bottom", "in", "out" or the like is described on the basis of the direction or position relationship shown in figure(s), and it is only for the purpose of describing the present disclosure conveniently and simplifying the description, but it does not indicate or imply that the referred device or member must have a particular direction or position, or be constructed or operated in a particular direction or position. As a result, it should not be interpreted as limiting the present disclosure.

The term "first" or "second" is only used for description purpose, but cannot be understood to indicate or suggest the relative importance or to imply the amount of the indicated technical feature. Therefore, the feature defined with "first" or "second" may explicitly or implicitly comprise one or more such feature(s). In the description of the present disclosure, "multiple" has a meaning of two or more, unless specified otherwise.

In the description of the present disclosure, it should be noted that, unless specified and defined otherwise, term "installing", "connecting", or "linking" should be broadly interpreted, for example, it can be fixedly connecting, detachably connecting, or integrally connecting. Those skilled in the art can understand the particular meanings of the above terms in the present disclosure according to particular circumstances.

With continuous development of display technologies, organic light emitting diodes (OLEDs) attract more and more attentions due to their features of self-luminescence and flexibility.

Figure 1:
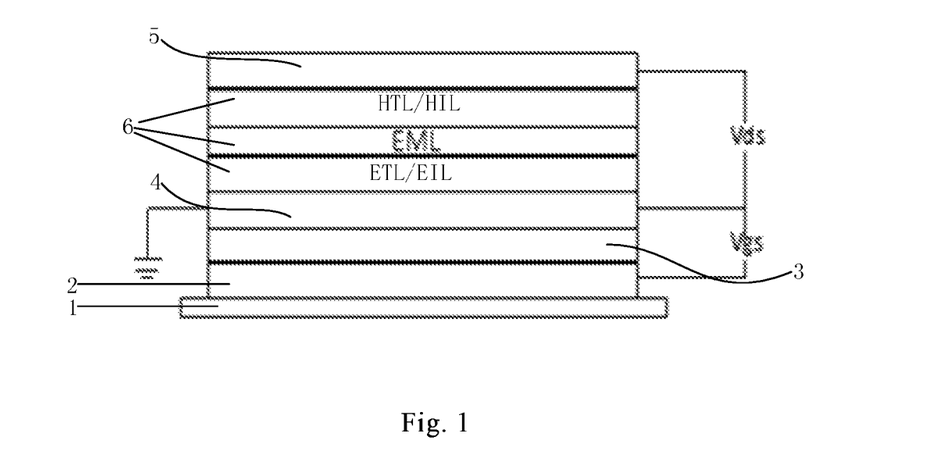
FIG. 1 is a schematic structural diagram of an organic light emitting transistor provided in the related art.
Figure 2:
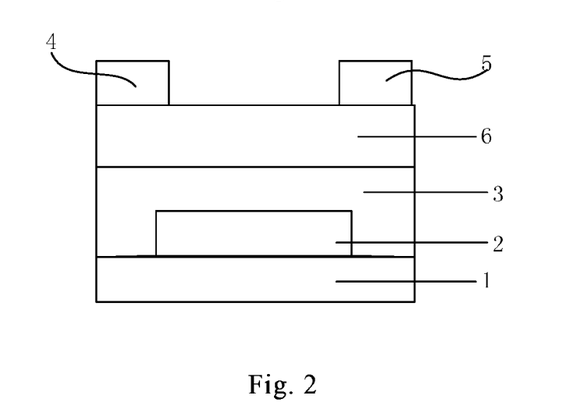
FIG. 2 is a schematic structural diagram of another organic light emitting transistor provided in the related art.
Figure 3:
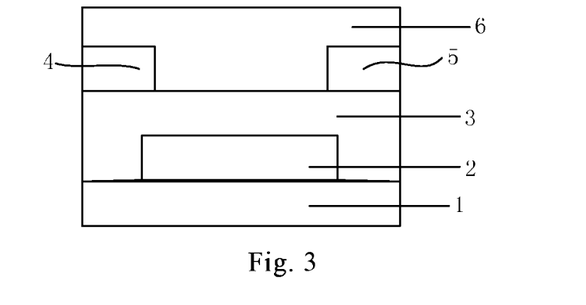
FIG. 3 is a schematic structural diagram of yet another organic light emitting transistor provided in the related art.

Currently existing organic light emitting transistor (OLET) is a new type of electroluminescent device. It is a device having a combination of luminescence (OLED) and switch (OFET) functions. Particular structures of an OLET device are as shown in FIG. 1, FIG. 2 and FIG. 3. The device comprises a substrate 1, and a gate electrode 2, a gate insulating layer 3, a source electrode 4, a drain electrode 5 and a light emitting functional layer 6 disposed on the substrate 1, wherein the device may be classified into a horizontal type OLET and a vertical type OLET according to the relative positions of the source electrode 4 and the drain electrode 5. The horizontal type OLET means that the source electrode and the drain electrode are in the same horizontal plane, and the channel is in a horizontal direction. The vertical type OLET means that the source electrode, the drain electrode and the channel are all in a vertical direction.

FIG. 1 is a schematic structural diagram of a vertical type OLET. As shown in FIG. 1, the gate electrode 2, the gate insulating layer 3, the source electrode 4, the light emitting functional layer 6 and the drain electrode 5 are sequentially disposed in lamination on the substrate 1 from bottom to top. Of course, the sequence of the layers on the substrate 1 from bottom to top may also be: the drain electrode 5, the light emitting functional layer 6, the source electrode 4, the gate insulating layer 3 and the gate electrode 2. FIG. 2 and FIG. 3 show schematic structural diagrams of a horizontal type OLET, wherein, the gate electrode 2, the gate insulating layer 3 and the light emitting functional layer 6 are sequentially disposed in lamination on the substrate 1 from bottom to top, and the source electrode 4 and the drain electrode 5 are disposed on the light emitting functional layer 6, wherein a channel is formed in the light emitting functional layer 6 between the source electrode 4 and the drain electrode 5. In both structures, a gate voltage is used to control the magnitude of current so as to control the luminescence behavior. As compared to an OLED device, the integration level of the device is greatly improved and the manufacture process is simplified, by integrating two functions into one device. However, such an OLET device is only limited to control the luminescence behavior.

Figure 4:
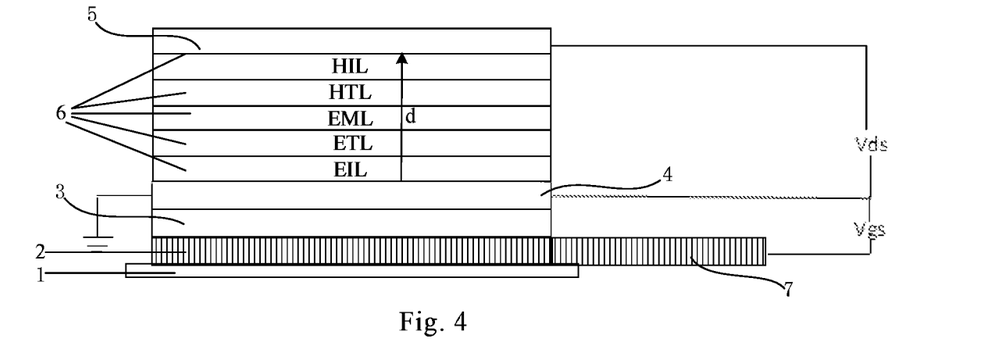
FIG. 4 is a schematic structural diagram of an organic light emitting transistor based on FIG. 1 provided in an embodiment of the present disclosure.

The embodiments of the present disclosure provide an organic light emitting transistor, as shown in FIG. 4, which, based on the vertical type organic light emitting transistor shown in FIG. 1, further comprises an external electrode 7 coupled to the gate electrode 2. In an integrated body comprised of the gate electrode 2 and the external electrode 7, a portion of the material is a thermosensitive material, and the remaining portion of the material is a non-thermosensitive material. The proportion of thermosensitive material in the gate electrode 2 is different from the proportion of the thermosensitive material in the external electrode 7, such that a ratio of a resistance of the gate electrode 2 to a resistance of the external electrode 7 may change with temperature. The proportion of thermosensitive material can be calculated by in terms of weight ratio of the thermosensitive material relative to the total weight of the thermosensitive material and the non-thermosensitive material. Likewise, an organic light emitting transistor, based on the horizontal type organic light emitting transistor shown in FIG. 2 or FIG. 3, may also comprise an external electrode 7 coupled to the gate electrode 2 in series, and an integrated body comprised of the gate electrode 2 and the external electrode 7 has the same features as that of the integrated body of the vertical type organic light emitting transistor described above, which will not be reiterated here.

The thermosensitive material is a material in which the resistance is greatly influenced by temperature. The non-thermosensitive material, relative to the thermosensitive material, refers to a material in which the resistance is not influenced by temperature or the influence of temperature on the resistance can be omitted. That is, a thermosensitive material has a large temperature-dependent resistance change rate, and a non-thermosensitive material has a small temperature-dependent resistance change rate. Here, the term "temperature-dependent resistance change rate" means a change rate of resistance along with (the change of) temperature. It should be noted that the thermosensitive material may be selected depending on the temperature change range of an object to be detected. For example, if the body temperature of a human body is to be measured, a material with a great resistance change in the temperature change range of from 35° C. to 42° C. may be selected.

In one example of the present disclosure, the thermosensitive material is a mixture of carbon nanotubes and poly (3,4-ethylenedioxythiophene)-poly(styrenesulfonate) (PE-DOT-PSS) having a core-shell structure. Here, poly(3,4-ethylenedioxythiophene) and poly(styrenesulfonate) have such a core-shell structure that the outside of poly(3,4-ethylenedioxythiophene) is encapsulated by poly(styrenesulfonate) as a shell. Poly(styrenesulfonate) is an insulative material, and poly(3,4-ethylenedioxythiophene) is electrically conductive. In operation, the core-shell structure changes with temperature. As a result, the resistance of the thermosensitive material changes with temperature.

Here, the mass fraction of carbon nanotubes is not limited. Carbon nanotubes have good electrical conductivity. The electrical conductivity of the thermosensitive material may be controlled by adjusting the mass fraction of carbon nanotubes. As a result, different requirements for temperature detection can be met.

In another example of the present disclosure, the mass fraction of carbon nanotubes in the thermosensitive material is 1-5%. The temperature sensitive range of the resistance of the thermosensitive material is controlled within 35 to 45° C., and can be used for measuring the temperature of body surface.

In the integrated body comprised of the gate electrode 2 and the external electrode 7, a portion of the material is a thermosensitive material, and the remaining portion of the material is a non-thermosensitive material (for the convenience of description, in the description below, the portion of the thermosensitive material is referred to as a thermosensitive portion, and the portion of the non-thermosensitive material is referred to as a non-thermosensitive portion). Typically, orthographic projections of the thermosensitive portion and the non-thermosensitive portion on the substrate 1 (i.e., the projections in a thickness direction of the substrate 1) are not overlapped with each other. When a temperature detection is performed by using the organic light emitting transistor, the resistance of the thermosensitive portion changes with temperature, while the resistance of the non-thermosensitive portion is constant. As such, the proportion of the thermosensitive portion in the gate electrode 2 and the proportion of the thermosensitive portion in the external electrode 7 determine the ratio of the resistance of the gate electrode 2 to the resistance of the external electrode 7.

The proportion of the thermosensitive portion in the gate electrode 2 and the proportion of the thermosensitive portion in the external electrode 7 are reflected by the materials thereof. There are mainly three combination modes of the materials. In a first combination mode, the gate electrode 2 is formed of a thermosensitive material, and the external electrode 7 is formed of a non-thermosensitive material. That is, the proportion of the thermosensitive portion in the gate electrode 2 is 100%, and the proportion of the thermosensitive portion in the external electrode 7 is 0%. In a second combination mode, the gate electrode 2 is formed of a non-thermosensitive material, and the external electrode 7 is formed of a thermosensitive material. That is, the proportion of the thermosensitive portion in the gate electrode 2 is 0%, and the proportion of the thermosensitive portion in the external electrode 7 is 100%. In a third combination mode, both the gate electrode 2 and the external electrode 7 comprise a thermosensitive portion and a non-thermosensitive portion. As compared to the two modes above, this mode requires the proportion of the thermosensitive portion in the gate electrode 2 being different from the proportion of the thermosensitive portion in the external electrode 7. In this way, a technical effect that the ratio of the resistance of the gate electrode 2 to the resistance of the external electrode 7 changes with temperature can be achieved. For the ratio of the resistance of the gate electrode 2 to the resistance of the external electrode 7 in this mode, various influence factors such as structure and material, in addition to the proportion of the thermosensitive portion, should be taken into consideration. Therefore, the manufacture is simpler in the two modes above than in this mode.

Further, since the gate electrode 2 and the external electrode 7 are coupled in series, consequently, when a constant voltage is applied on the gate electrode 2 and the external electrode 7, the partial voltage of the gate electrode 2 (i.e. the gate voltage, which is proportional to the resistance of the gate electrode) can change with temperature as the ratio of the resistance of the gate electrode 2 to the resistance of the external electrode 7 changes with temperature. By selecting a specific material for the light emitting functional layer 6, the luminescence color or luminescence intensity can be controlled at different gate voltages, and thus the temperature can be indicated, thereby achieving the qualitative measurement of temperature.

The position relationship between the gate electrode 2 and the external electrode 7 is not particularly limited. For example, the external electrode 7 may be obtained by extending the gate electrode 2 in a plane where it locates in. In this case, for a vertical type OLET and a horizontal type OLET, the gate electrode 2 refers to a portion in the integrated body (comprised of the gate electrode 2 and the external electrode 7) which is overlapped with at least one of the light emitting functional layer 6, the source electrode 4 and the drain electrode 5, and the remaining portion in the integrated body is the external electrode 7, i.e. a portion in the integrated body which is not overlapped with the light emitting functional layer, the source electrode and the drain electrode.

Here, the portion as the gate electrode 2 and the portion as the external electrode 7 in the integrated body comprised of the gate electrode 2 and the external electrode 7 are described in detail by taking a horizontal type OLET as an example.

Figure 5:
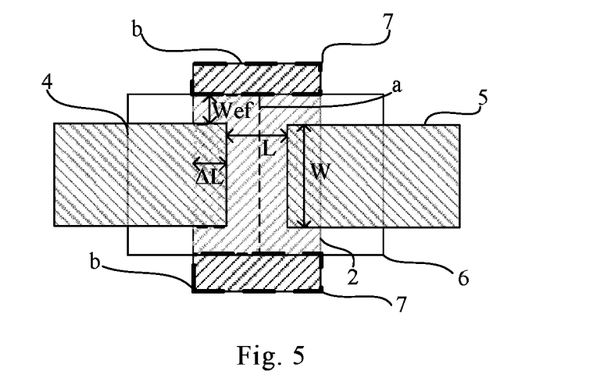
FIG. 5 is a top view of an organic light emitting transistor based on FIG. 2 and FIG. 3 provided in an embodiment of the present disclosure.
Figure 6:
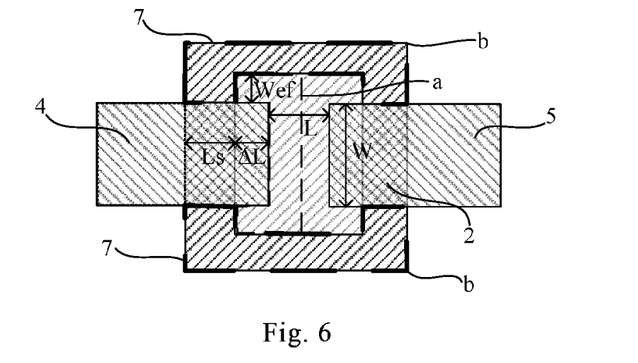
FIG. 6 is a top view of another organic light emitting transistor based on FIG. 2 and FIG. 3 provided in an embodiment of the present disclosure.

As shown in FIG. 5, similar to the structure of a non-light shielding type thin film transistor, in an ON state, the portion of the gate electrode 2 having driving function comprises two parts, one of which corresponds to the overlapping amount ΔL between the gate electrode 2 and the source electrode 4, referred to as n+diffusion layer capacitance $C_{gsn}$, and the other of which is a non-$C_{gsn}$ part enclosed by dashed line a as shown in FIG. 5, referred to as intrinsic capacitance $C_{gsi}$. Total $C_{gs}$ can be calculated from equation (I), where $\varepsilon_r$ represents the dielectric constant of the light emitting functional layer, $t_{ox}$ represents the thickness of the light emitting functional layer, $W_{ef}$ represents the equivalent width of the light emitting functional layer 6 above and below the source electrode 4 participating in electrical conduction, $\varepsilon_0$ represents the vacuum dielectric constant, W represents the thickness of the channel, and L represent the length of the channel In this case, the external electrode 7 is an area enclosed by dash line b as shown in FIG. 5. As shown in FIG. 6, similar to the structure of a light shielding type thin film transistor, in an ON state, i.e. in the case of applying a positive gate electrode, the portion of the gate electrode 2 having driving function comprises two parts, one of which corresponds to the overlapping amounts $L_s$ and ΔL between the gate electrode 2 and the source electrode 4, referred to as $n^+$ diffusion layer capacitance $C_{gsn}$, and the other of which is a non-$C_{gsn}$ part enclosed by dashed line a as shown in FIG. 6, referred to as intrinsic capacitance $C_{gsi}$. Total $C_{gs}$ can be calculated from equation (II), where $\varepsilon_r$ represents the dielectric constant of the light emitting functional layer, $t_{ox}$ represents the thickness of the light emitting functional layer, $W_{ef}$ represents the equivalent width of the light emitting functional layer 6 above and below the source electrode 4 participating in electrical conduction, Co represents the vacuum dielectric constant, W represents the thickness of the channel, and L represent the length of the channel In this case, the external electrode 7 is an area enclosed by dash line b as shown in FIG. 6.

$$C_{gs} = C_{gsn} + C_{gsi} = \varepsilon_0\varepsilon_r\frac{\Delta L(W + 2W_{ef})}{t_{ox}} + \varepsilon_0\varepsilon_r\frac{L(W + 2W_{ef})}{t_{ox}} \quad (I)$$

$$C_{gs} = C_{gsn} + C_{gsi} = \varepsilon_0\varepsilon_r\frac{\Delta L(W + 2W_{ef})}{t_{ox}} + \varepsilon_0\varepsilon_r\frac{L_s W}{t_{ox}}\varepsilon_0\varepsilon_r\frac{L(W + 2W_{ef})}{t_{ox}} \quad (II)$$

The organic light emitting transistor provided in the embodiments of the present disclosure may have a structure based on a horizontal type OLET, and may have a structure based on a vertical type OLET. The structure based on a vertical type OLET is as show in FIG. 4, where along a direction perpendicular to the substrate 1, the gate electrode 2, the gate insulating layer 3, the source electrode 4, the light emitting functional layer 6 and the drain electrode 5 are sequentially disposed in lamination. Since the thickness between the source electrode 4 and the drain electrode 5, i.e. the thickness of the light emitting functional layer 6, is the length L of the channel, the structure based on a vertical type OLET has advantages such as short channel, low operating voltage, high regulation and control capability and high quantum efficiency as compared to the structure based on a horizontal type OLET.

Here, the structure of the gate electrode 2 is not particularly limited. The gate electrode 2 may have a plate shape, a sheet shape, a strip shape or a net shape.

Figure 7:
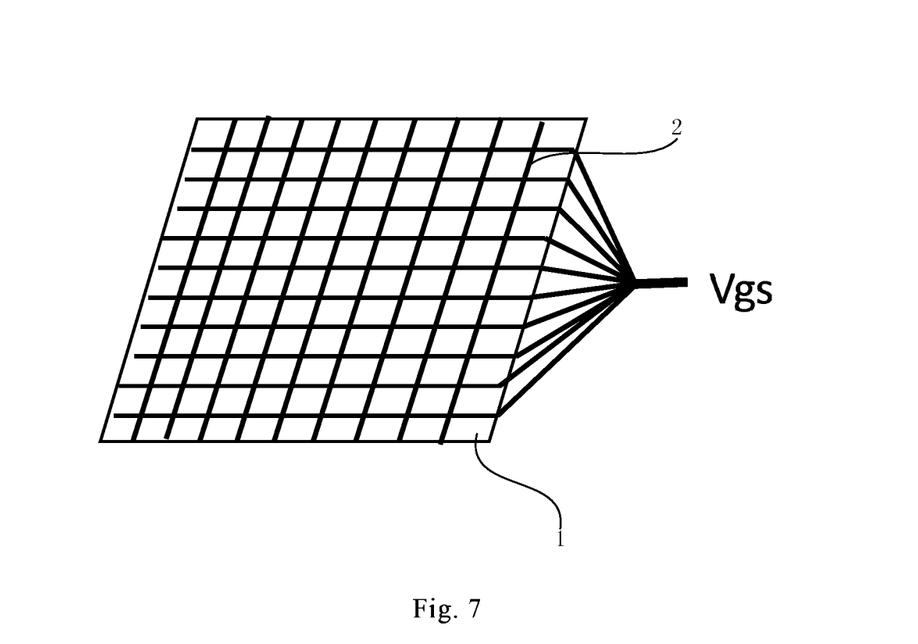
FIG. 7 is a schematic structural diagram of a gate electrode provided in an embodiment of the present disclosure.
Figure 8:
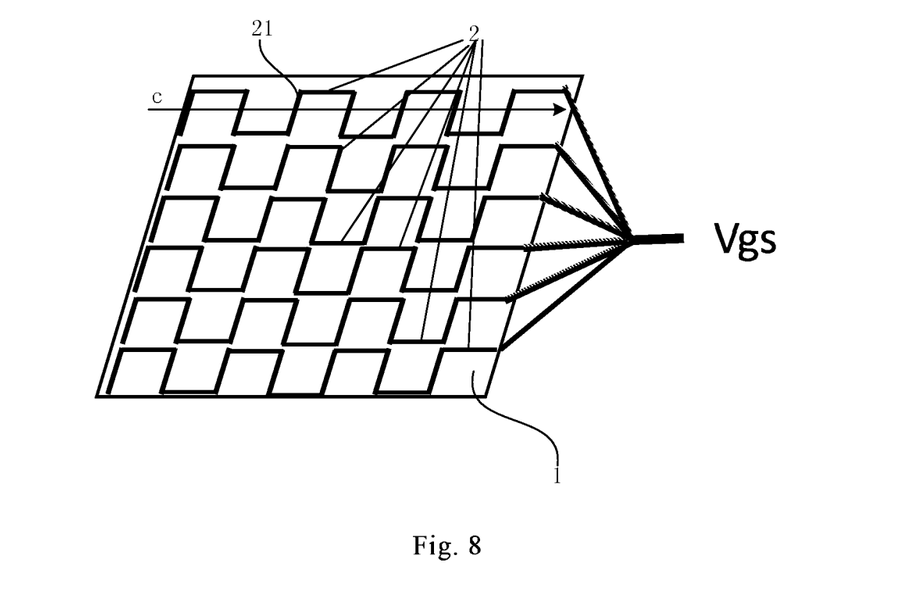
FIG. 8 is a schematic structural diagram of another gate electrode provided in an embodiment of the present disclosure.

In one example of the present disclosure, as shown in FIG. 7, the substrate 1 is a flexible substrate, and the gate electrode 2 has a grid shape; or alternatively, the gate electrode 2 comprises one electrode wire. Alternatively, as shown in FIG. 8, the gate electrode 2 comprises at least two electrode wires 21 sequentially arranged, and an arrangement direction of the at least two electrode wires 21 is perpendicular to the extending direction of the electrode wires 21, wherein the electrode wires 21 are arranged with concave and convex distributed alternately in the extending direction (the direction as indicated with arrow c in the figure).

The expression of electrode wires 21 being arranged with concave and convex distributed alternately in the extending direction means that the electrode wires 21 are in a wave shape having concave and convex in the extending direction. For example, the electrode wires 21 may have a sinusoidal wave shape, a square wave shape or a triangle wave shape.

In the embodiments of the present disclosure, by using a flexible substrate, and making the gate electrode 2 have a grid shape, or making the electrode wires 21 be in a wave shape having concave and convex in the extending direction, the tensile deformation can be improved, and when measuring temperature, the measurement precision can be increased by contacting an object to be measured fittingly.

Here, the material of the flexible substrate may be polyethylene terephthalate (PET), polyimide (PI), polyurethane (PU), or the like.

In yet another example of the present disclosure, in the case where a constant voltage is applied on the integrated body comprised of the gate electrode 2 and the external electrode 7, the source electrode 4, and the drain electrode 5, such that a positive voltage difference or a negative voltage difference is formed between the gate electrode 2 and the source electrode 4 and between the drain electrode 5 and the source electrode 4 respectively, the color of a light output from the light emitting functional layer 6 may change with the resistance of the gate electrode 2, that is, the color of the light output from the light emitting functional layer 6 may change with temperature. As such, the temperature to be detected can be indicated by the color of output light, enabling the qualitative measurement of temperature.

Here, different colors of output light may be selected for indicating, depending on different temperatures. In the case where the organic light emitting transistor is used for detecting body temperature, when the body temperature of a human is in a normal body temperature range of 35 to 37° C., the color of output light may be selected to be yellow, and when the body temperature of a human having a fever is in a range of 37.1 to 40° C., the color of output light may be selected to be red. Alternatively, the color of output light may be selected to be green at a normal body temperature, and be blue when a human has a fever. The color indication is not particularly limited here. In practical applications, suitable light emitting functional material and/or structure may be selected to achieve the desired color of output light.

In one possible example of the present disclosure, the light emitting functional layer 6 comprises an electron injection layer (EIL), a light emitting layer (EML) and a hole injection layer (HIL) sequentially disposed in lamination, wherein the material of the hole injection layer may be 4,4',4"-tri(N-3-methylphenyl-N-phenylamino)triphenylamine; the material of the light emitting layer may be a mixture of 2,9-dimethyl-4,7-diphenyl-1,10-phenenthroline (BCP) and 4-(dicyanomethylene)-2-t-butyl-6-(1,1,7,7-tetramethyljulolidyl-9-enyl)-4H-pyran (DCJTB), where the mass fraction of DCJTB in the light emitting layer may be in a range of 0.5% to 10%, for example about 3%; and the material of the electron injection layer may be lithium fluoride.

As another possible example of the present disclosure, in one case, the material of the electron injection layer may further comprise 8-hydroxyquinoline aluminum, and the material of the hole injection layer may further comprise N,N'-diphenyl-N,N'-(1-naphthyl)-1,1'-biphenyl- 4,4'-diamine (NPB). Since 8-hydroxyquinoline aluminum has an electron transport function, and N,N'-diphenyl-N,N'-(1-naphthyl)-1,1'-biphenyl-4,4'-diamine has a hole transport function, the recombination efficiency of electron and hole can be improved. By using luminescence of two layers of blue light emitting NPB and red light emitting BCP doped with DCJTB, a light emitting functional layer in which the color of output light can be controlled with voltage is obtained. As a result, a temperature can be indicated through the color change of output light.

In another case, as shown in FIG. 4, the light emitting functional layer 6 further comprises an electron transport layer (ETL), a light emitting layer (EML) and a hole transport layer (HTL), wherein the electron transport layer is disposed between the electron injection layer and the light emitting layer, and the hole transport layer is disposed between the light emitting layer and the hole injection layer, wherein the material of the hole transport layer may be N,N'-diphenyl-N,N'-(1-naphthyl)-1,1'-biphenyl-4,4'-diamine (NPB). Likewise, the recombination efficiency of electron and hole can be improved.

In application, the electron injection layer, the electron transport layer, the light emitting layer, the hole transport layer and the hole injection layer in the light emitting functional layer 6 may be sequentially disposed in lamination in a direction away from the gate electrode 2 (a direction as indicated by arrow d in FIG. 4), or in a direction close to the gate electrode 2. The voltage differences between the gate electrode 2 and the source electrode 4 and between the drain electrode 5 and the source electrode 4 may be positive or negative depending on different arrangement directions of the electron injection layer, the electron transport layer, the light emitting layer, the hole transport layer and the hole injection layer.

Figure 9:
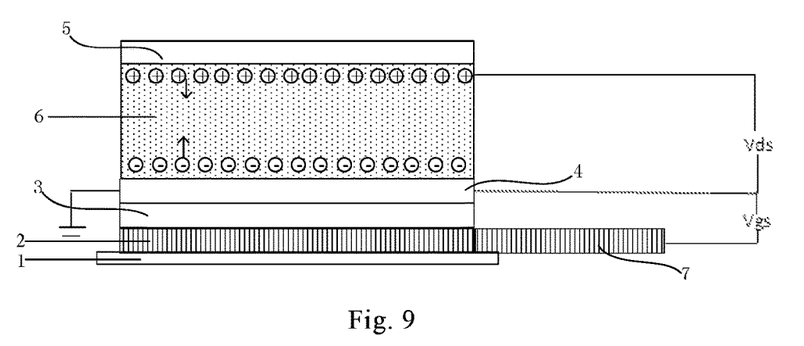
FIG. 9 is a schematic diagram showing the light emitting principle of an organic light emitting transistor based on FIG. 4 provided in an embodiment of the present disclosure.

Here, the luminescence principle of the light emitting functional layer 6 is explained by taking the case where the OLET is a vertical type OLET and the voltage differences between the gate electrode 2 and the source electrode 4 and between the drain electrode 5 and the source electrode 4 are both positive as an example. As shown in FIG. 9, the gate insulating layer 3 is equivalent to a capacitor unit. A large amount of electrons will be induced at the interface between the source electrode 4 and the gate insulating layer 3 under an action of gate electric field, and aggregate at the interface between the source electrode 4 and the light emitting functional layer 6. The electrons will have a chance to tunnel into the light emitting functional layer 6 and recombine with holes therein to emit light under an attraction of the voltage of the drain electrode 5.

Where, the thickness of the hole injection layer may be 5 to 100 nm, the thickness of the hole transport layer may be 15 to 100 nm, the thickness of the light emitting layer may be 10 to 30 nm, the thickness of the electron transport layer may be 20 to 30 nm, and the thickness of the electron injection layer may be 0.5 to 1 nm, which are not particularly limited here.

Figure 10:
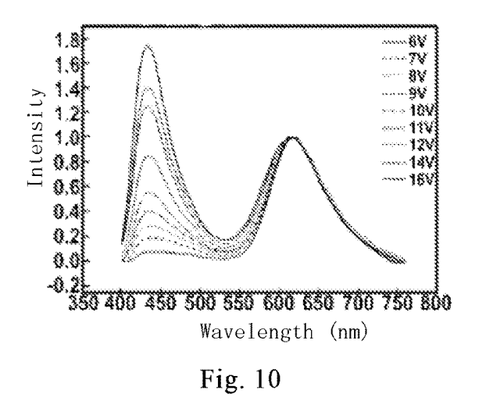
FIG. 10 is a normalized EL spectrum of a light emitting functional layer provided in an embodiment of the present disclosure at different driving voltages.

In one example of the present disclosure, the thickness of the hole injection layer is 5 nm, the thickness of the hole transport layer is 50 nm, the thickness of the light emitting layer is 25 nm, the thickness of the electron transport layer is 25 nm, and the thickness of the electron injection layer is 0.5 nm. In this case, FIG. 10 shows a normalized EL spectrum of the light emitting functional layer 6 at different driving voltages. As seen from FIG. 10, in addition to a red light emitting of DCJTB at 617 nm, a blue light emitting band of NPB at 435 nm also occurs. At a low driving voltage of 6 V, the red light emitting of DCJTB is predominant. As the driving voltage increases, the blue light emitting of NPB is significantly enhanced, that is, the relative intensity of the blue light of NPB with respect to the red light of DCJTB is significantly enhanced in the spectrum, and thus it occurs that the color of output light continuously changes with voltage.

The color adjustment effect can be explained with the redistribution of excitons in the recombination region. The EL spectrum at low DC voltage comprises a primary peak of DCJTB and a secondary peak of NPB. Therefore, the excitons are distributed in both layers of NPB and BCP doped with DCJTB, but are mainly distributed in the doped layer. When the driving voltage Vgsi is increased to 16 V, the excitons are mainly distributed in the NPB layer, yielding a strong blue light emitting of NPB and a weak red light emitting of DCJTB. As such, when the driving voltage is increased from 6 V to 16 V, the color of output light continuously changes with voltage, from orange to violet.

The embodiments of the present disclosure provide an organic light emitting transistor, in which, by coupling a gate electrode 2 to an external electrode 7 in series and reasonably configuring the gate electrode 2 and the external electrode 7, it allows the ratio of the resistance of the gate electrode 2 to the resistance of the external electrode 7 to change with temperature, that is, the partial voltage on the gate electrode 2 changes with temperature. As such, by disposing a light emitting functional layer 6 which changes color or luminescence intensity with the gate voltage, a temperature change can be indicated, and thus a quantitative measurement of temperature can be realized by quantifying the temperature change. Therefore, the integration level and versatility of the organic light emitting transistor can be further improved by integrating a temperature detection function with a light emitting function.

Figure 11:
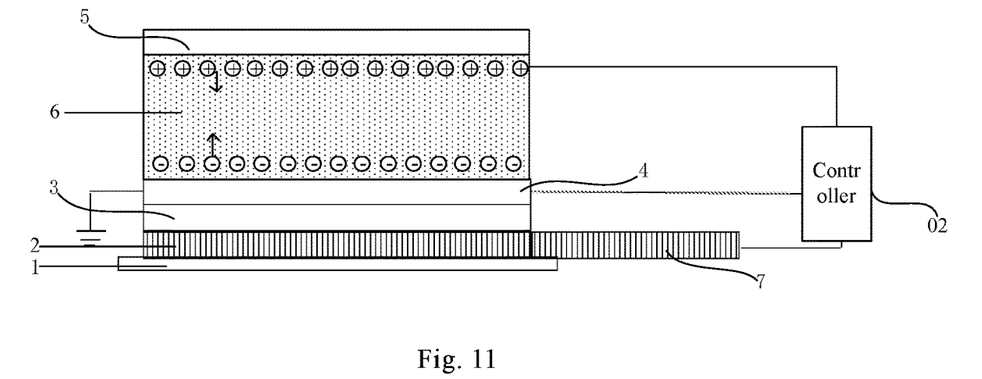
FIG. 11 is a schematic structural diagram of a temperature sensing device provided in an embodiment of the present disclosure.

The embodiments of the present disclosure provide a temperature sensing device. As shown in FIG. 11, the temperature sensing device comprises: the organic light emitting transistor as described above, and a controller 02 coupled to the gate electrode 2, the source electrode 4 and the drain electrode 5 of the organic light emitting transistor, wherein the controller is used to apply a voltage to an integrated body comprised of the gate electrode 2 and the external electrode 7, the source electrode 4 and the drain electrode 5, such that a positive voltage difference or a negative voltage difference is formed between the gate electrode and the source electrode and between the drain electrode and the source electrode respectively; acquire a real-time source/drain current Idsx, and acquire a real-time gate electrode voltage $Vgsx_1$ from the real-time source/drain current Idsx according to a correspondence relationship between the source/drain current Ids and the gate electrode voltage $Vgs_1$; acquire a real-time first resistance Rx from the real-time gate electrode voltage $Vgsx_1$ according to a correspondence relationship between the first resistance R and the gate electrode voltage $Vgs_1$; and acquire a real-time temperature Tx of an object to be detected from the real-time first resistance Rx according to a correspondence relationship between the first resistance R and the temperature T, wherein the first resistance R is a resistance of a thermosensitive material in the integrated body comprised of the gate electrode and the external electrode or a resistance of the integrated body comprised of the gate electrode and the external electrode.

In the temperature sensing device provided in the embodiments of the present disclosure, a voltage is applied by the controller to the integrated body comprised of the gate electrode 2 and the external electrode 7, the source electrode 4 and the drain electrode 5, such that a positive voltage difference or a negative voltage difference is formed between the gate electrode 2 and the source electrode 4 and between the drain electrode 5 and the source electrode 4 respectively. The gate electrode 2 and the external electrode 7 sense the temperature of an object to be detected. The resistance of the thermosensitive material changes with the temperature of the object to be detected, such that the partial voltage on the gate electrode 2 changes accordingly, that is, the gate voltage changes, and thus the current across the source/drain electrodes changes. As a result, the number of the recombined excitons changes. As such, the luminescence intensity or luminescence color can be adjusted to enable a qualitative measurement. Here, the quantitative measurement of temperature can be realized by acquiring a real-time source/drain current Idsx; acquiring a real-time gate electrode voltage $Vgsx_1$ from the real-time source/drain current Idsx according to a correspondence relationship between the source/drain current Ids and the gate electrode voltage $Vgs_1$; acquiring a real-time first resistance Rx from the real-time gate electrode voltage $Vgsx_1$ according to a correspondence relationship between the first resistance R and the gate electrode voltage $Vgs_1$; and acquiring the temperature Tx of the object to be detected from the real-time first resistance Rx according to a correspondence relationship between the first resistance R and the temperature T.

The embodiments of the present disclosure also provide a temperature detecting method using the organic light emitting transistor as described above, as shown in FIG. 12, the method comprising the following steps.

Figure 12:
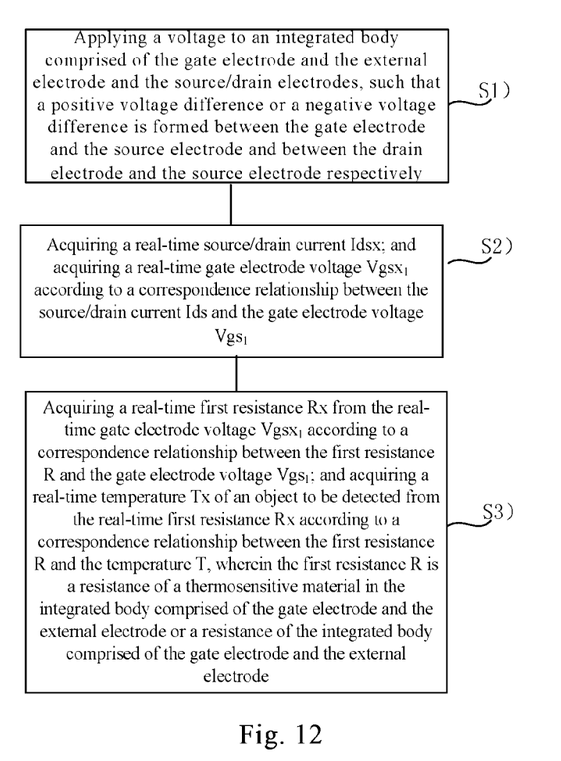
FIG. 12 is a schematic flow chart of a temperature detecting method provided in an embodiment of the present disclosure.

S1) Applying a voltage to the source/drain electrodes and an integrated body comprised of the gate electrode and the external electrode, such that a positive voltage difference or a negative voltage difference is formed between the gate electrode and the source electrode and between the drain electrode and the source electrode respectively.

Here, the case where a positive voltage difference is formed between the gate electrode and the source electrode and between the drain electrode and the source electrode respectively is taken as an example. As shown in FIG. 9, when a positive voltage difference is formed between the drain electrode 5 and the source electrode 4, there is only one kind of carrier, i.e. hole, in the light emitting functional layer 6. When a positive voltage difference is formed between the gate electrode 2 and the source electrode 4, the gate insulating layer 3 is equivalent to a capacitor unit. Under an action of gate electrical field, a large number of electrons will be induced at the interface between the source electrode 4 and the gate insulating layer 3, and aggregate at the interface between the source electrode 4 and the light emitting functional layer 6. The electrons will have a chance to tunnel into the light emitting functional layer 6 and recombine with holes to emit light under an attraction of the voltage of the drain electrode 5. Since the ratio of the resistance of the gate electrode 2 to the resistance of the external electrode 7 changes with temperature, the gate voltage, i.e. the voltage applied on the gate electrode 2, will change with temperature, in the case where a constant voltage is applied. As such, as the gate voltage changes, the number of electrons generated will change. As a result, the chance of the recombination of electron and hole is influenced, and in turn the luminescence intensity or luminescence color will be controlled, thereby enabling the qualitative detection of temperature.

S2) Acquiring a real-time source/drain current Idsx; and acquiring a real-time gate electrode voltage $Vgsx_1$ according to a correspondence relationship between the source/drain current Ids and the gate electrode voltage $Vgs_1$.

Here, the real-time source/drain current may be measured by Keithley-2400, to obtain the real-time source/drain current Idsx. The correspondence relationship between the source/drain current Ids and the gate electrode voltage $Vgs_1$ may be obtained in advance.

S3) Acquiring a real-time first resistance Rx from the real-time gate electrode voltage $Vgsx_1$ according to a correspondence relationship between the first resistance R and the gate electrode voltage $Vgs_1$; and acquiring a real-time temperature Tx of an object to be detected from the real-time first resistance Rx according to a correspondence relationship between the first resistance R and the temperature T, wherein the first resistance R is a resistance of a thermosensitive material in the integrated body comprised of the gate electrode and the external electrode or a resistance of the integrated body comprised of the gate electrode and the external electrode.

Here, the correspondence relationship between the gate electrode voltage $Vgs_1$ and the first resistance R and the correspondence relationship between the first resistance R and the temperature T may be obtained in advance.

The embodiments of the present disclosure provide a temperature detecting method using the organic light emitting transistor as described above. The temperature of the object to be detected can be quantitatively measured by firstly acquiring a real-time source/drain current Idsx when applying a voltage; acquiring a real-time gate electrode voltage Vgsx$_1$ according to a correspondence relationship between the source/drain current Ids and the gate electrode voltage Vgs$_1$; then acquiring a real-time first resistance Rx from the real-time gate electrode voltage Vgsx$_1$ according to a correspondence relationship between the gate electrode voltage Vgs$_1$ and the first resistance R; and acquiring a temperature Tx from the real-time first resistance Rx according to a correspondence relationship between the first resistance R and the temperature T.

Figure 13:
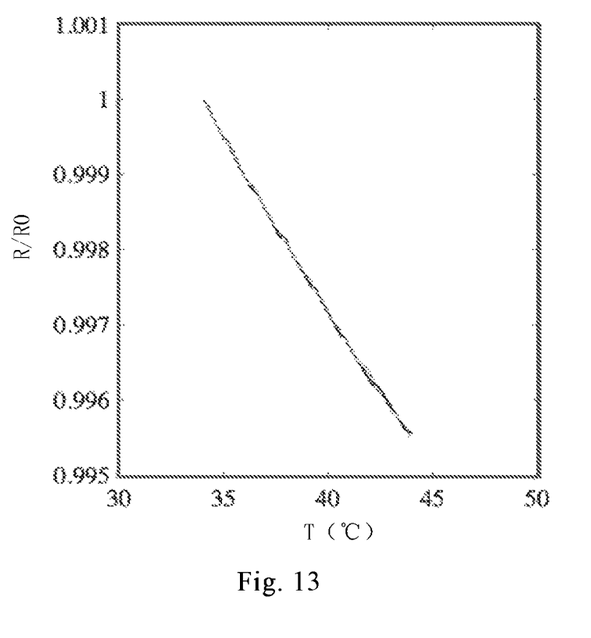
FIG. 13 is a plot showing a correspondence relationship between gate electrode resistance and temperature provided in an embodiment of the present disclosure.

Here, in the case where the material of the gate electrode 2 is a thermosensitive material and the material of the external electrode 7 is a non-thermosensitive material, the first resistance R is a resistance of the thermosensitive material, i.e. the gate electrode resistance. Where, the correspondence relationship between the gate electrode resistance R and the temperature T fulfills the following equation: T=T0 +(R−R0)/αR0, wherein T is a temperature to be detected, T0 is an initial temperature, R0 is an initial gate electrode resistance, R is a real-time gate electrode resistance, and α is a temperature coefficient of resistance (negative). In the correspondence relationship curve as shown in FIG. 13, when the initial temperature T0 is detectable, the temperature T of the object to be detected can be obtained from R/R0. As seen from the curve of the correspondence relationship between the gate electrode resistance R and the temperature T shown in FIG. 13, as the temperature T increases, R/R0 decreases, and the voltage loaded on the gate electrode decreases accordingly. In combination with FIG. 10, it can be seen that when the voltage is 6 V, the red light emitting of DCJTB is predominant, and thus the light emitting functional layer emits a red light. As the voltage increases from 6 V to 16 V, the temperature varies from high temperature to low temperature, and the color changes from red through yellow to violet.

The above descriptions are only some particular embodiments of the present disclosure, but the protection scope of the present invention is not limited thereto. Within the technical scope disclosed herein, one skilled in the art can readily envisage variations and alternatives, and all of them are covered by the protection scope of the present invention. Therefore, the protection scope of the present invention is defined by the claims only.

What is claimed is:

1. An organic light emitting transistor, comprising:
a substrate, and
a gate electrode, a gate insulating layer, source/drain electrodes and a light emitting functional layer disposed on the substrate,
wherein the organic light emitting transistor further comprises:
an external electrode coupled to the gate electrode in series, wherein a temperature-dependent resistance change rate of the gate electrode is different from a temperature-dependent resistance change rate of the external electrode.

2. The organic light emitting transistor according to claim 1, wherein an integrated body comprised of the gate electrode and the external electrode comprises a thermosensitive portion formed by a thermosensitive material and a non-thermosensitive portion formed by a non-thermosensitive material, wherein the proportion of the thermosensitive portion in the gate electrode is different from the proportion of the thermosensitive portion in the external electrode.

3. The organic light emitting transistor according to claim 2, wherein a material for forming the gate electrode is a thermosensitive material, and a material for forming the external electrode is a non-thermosensitive material.

4. The organic light emitting transistor according to claim 2, wherein a material for forming the external electrode is a thermosensitive material, and a material for forming the gate electrode is a non-thermosensitive material.

5. The organic light emitting transistor according to claim 2, wherein the thermosensitive material is a mixture of carbon nanotubes and poly(3,4-ethylenedioxythiophene)-poly(styrenesulfonate) having a core-shell structure.

6. The organic light emitting transistor according to claim 1, wherein a light output by the light emitting functional layer has a color which changes with a resistance of the gate electrode.

7. The organic light emitting transistor according to claim 1, wherein the light emitting functional layer comprises an electron injection layer, a light emitting layer and a hole injection layer sequentially disposed in lamination.

8. The organic light emitting transistor according to claim 7, wherein a material of the light emitting layer comprises a mixture of 2,9-dimethyl-4,7-diphenyl-1,10-phenenthroline (BCP) and (4-(dicyanomethylene)-2-t-butyl-6-(1,1,7,7-tetramethyljulolidyl-9-enyl)-4H-pyran) (DCJTB), wherein a ratio of DCJTB in the light emitting layer is in a range of 0.5 wt % to 10 wt %.

9. The organic light emitting transistor according to claim 7, wherein a material of the hole injection layer comprises 4,4',4''-tri(N-3-methylphenyl-N-phenylamino)triphenylamine, and a material of the electron injection layer comprises lithium fluoride.

10. The organic light emitting transistor according to claim 7, further comprising an electron transport layer and a hole transport layer, wherein the electron transport layer is disposed between the electron injection layer and the light emitting layer, and the hole transport layer is disposed between the light emitting layer and the hole injection layer.

11. The organic light emitting transistor according to claim 10, wherein a material of the hole transport layer comprises N,N'-diphenyl-N,N'-(1-naphthyl)-1,1'-biphenyl-4,4'-diamine (NPB), and a material of the electron transport layer comprises 8-hydroxyquinoline aluminum.

12. The organic light emitting transistor according to claim 9, wherein a material of the electron injection layer further comprises 8-hydroxyquinoline aluminum, and a material of the hole injection layer further comprises N,N'-diphenyl-N,N'-(1-naphthyl)-1,1'-biphenyl-4,4'-diamine.

13. The organic light emitting transistor according to claim 1, wherein the substrate is a flexible substrate.

14. The organic light emitting transistor according to claim 1, wherein the gate electrode has a grid shape.

15. The organic light emitting transistor according to claim 1, wherein the gate electrode comprises at least two electrode wires sequentially arranged, and an arrangement direction of the at least two electrode wires is perpendicular to an extending direction of the at least two electrode wires, wherein the at least two electrode wires are arranged with concave and convex distributed alternately in the extending direction.

16. The organic light emitting transistor according to claim 1, wherein the gate electrode, the gate insulating layer, the source electrode, the light emitting functional layer and the drain electrode are sequentially disposed in lamination along a direction perpendicular to the substrate.

17. The organic light emitting transistor according to claim 1, wherein along a direction perpendicular to the substrate, the gate electrode, the gate insulating layer and the light emitting functional layer are sequentially disposed in lamination, and the source/drain electrodes are disposed on the light emitting functional layer, wherein a channel is formed in the light emitting functional layer between the source electrode and the drain electrode.

18. A temperature sensing device, comprising:
the organic light emitting transistor according to claim 1, and
a controller coupled to the gate electrode and the source/drain electrodes of the organic light emitting transistor,
wherein the controller is configured to apply a voltage to an integrated body comprised of the gate electrode and the external electrode and the source/drain electrodes, such that a positive voltage difference or a negative voltage difference is formed between the gate electrode and the source electrode and between the drain electrode and the source electrode respectively.

19. The temperature sensing device according to claim 18, wherein the controller is further configured to acquire a real-time source/drain current, and acquire a real-time gate electrode voltage from the real-time source/drain current according to a correspondence relationship between the source/drain current and the gate electrode voltage; and the controller is further configured to acquire a real-time first resistance from the real-time gate electrode voltage according to a correspondence relationship between the first resistance and the gate electrode voltage, and acquire a real-time temperature of an object to be sensed from the real-time first resistance according to a correspondence relationship between the first resistance and the temperature, wherein the first resistance is a resistance of a thermosensitive material in the integrated body comprised of the gate electrode and the external electrode or a resistance of the integrated body comprised of the gate electrode and the external electrode.

20. A temperature detecting method using the organic light emitting transistor according to claim 1, comprising:
applying a voltage to an integrated body comprised of the gate electrode and the external electrode and the source/drain electrodes, such that a positive voltage difference or a negative voltage difference is formed between the gate electrode and the source electrode and between the drain electrode and the source electrode respectively;
acquiring a real-time source/drain current; acquiring a real-time gate electrode voltage from the real-time source/drain current according to a correspondence relationship between the source/drain current and the gate electrode voltage;
acquiring a real-time first resistance from the real-time gate electrode voltage according to a correspondence relationship between the first resistance and the gate electrode voltage; and acquiring a real-time temperature of an object to be detected from the real-time first resistance according to a correspondence relationship between the first resistance and the temperature, wherein the first resistance is a resistance of a thermosensitive material in the integrated body comprised of the gate electrode and the external electrode or a resistance of the integrated body comprised of the gate electrode and the external electrode.

\* \* \* \* \*

UNITED STATES PATENT AND TRADEMARK OFFICE
CERTIFICATE OF CORRECTION

| | |
|---|---|
| PATENT NO. | : 11,462,719 B2 |
| APPLICATION NO. | : 16/408773 |
| DATED | : October 4, 2022 |
| INVENTOR(S) | : Rui Peng et al. |

Page 1 of 1

It is certified that error appears in the above-identified patent and that said Letters Patent is hereby corrected as shown below:

On the Title Page

Under Item (71), Line 7, insert the word --Hefei-- between the words "LTD." and "Anhui"

Under Item (73), Line 19, insert the word --Hefei-- between the words "LTD." and "Anhui"

Signed and Sealed this
Fifteenth Day of November, 2022

Katherine Kelly Vidal
*Director of the United States Patent and Trademark Office*